United States Patent
Liaw (10) Patent No.: US 7,277,312 B2
(45) Date of Patent: Oct. 2, 2007

(54) INTEGRATED SEMICONDUCTOR MEMORY WITH AN ARRANGEMENT OF NONVOLATILE MEMORY CELLS, AND METHOD

(75) Inventor: Corvin Liaw, Munich (DE)

(73) Assignee: Infineon Technologies AG, Munich (DE)

(*) Notice: Subject to any disclaimer, the term of this patent is extended or adjusted under 35 U.S.C. 154(b) by 64 days.

(21) Appl. No.: 11/341,902

(22) Filed: Jan. 27, 2006

(65) Prior Publication Data

US 2006/0187701 A1 Aug. 24, 2006

(30) Foreign Application Priority Data

Jan. 28, 2005 (DE) .................... 10 2005 004 107

(51) Int. Cl.
*G11C 17/00* (2006.01)
*G11C 11/24* (2006.01)

(52) U.S. Cl. .................. 365/100; 365/148; 365/175
(58) Field of Classification Search .............. 365/100, 365/148, 158, 171, 173, 175
See application file for complete search history.

(56) References Cited

U.S. PATENT DOCUMENTS

| | | | |
|---|---|---|---|
| 4,127,900 A | 11/1978 | Raffel et al. | |
| 4,242,736 A | 12/1980 | Raffel et al. | |
| 4,384,299 A | 5/1983 | Raffel et al. | |
| 6,635,914 B2 | 10/2003 | Kozicki et al. | |
| 6,646,912 B2* | 11/2003 | Hurst et al. | 365/175 |
| 6,687,149 B2* | 2/2004 | Chernobrod et al. | 365/175 |
| 6,990,012 B2* | 1/2006 | Smith et al. | 365/158 |
| 2003/0053350 A1 | 3/2003 | Krieger et al. | |

FOREIGN PATENT DOCUMENTS

| | | |
|---|---|---|
| DE | 27 48 222 A1 | 5/1978 |
| DE | 103 50 168 A1 | 6/2005 |
| EP | 1 137 012 A2 | 9/2001 |
| WO | WO99/28914 | 6/1999 |

OTHER PUBLICATIONS

Symanczyk, R., et al., "Electrical Characterization of Solid State Ionic Memory Elements," NVMTS 2003, 7 pages.

* cited by examiner

*Primary Examiner*—Trong Phan
(74) *Attorney, Agent, or Firm*—Slater & Matsil, L.L.P.

(57) ABSTRACT

In integrated semiconductor memories whose stored information is represented by the magnitude of the ohmic resistance of layer stacks with a respective layer comprising a solid electrolyte, the problem arises that although the fact that the large threshold values (G1, G2) for the writing voltage and the erasure voltage differ from memory cell to memory cell means that the memory cells can be programmed individually, said memory cells cannot conventionally be erased individually, i.e., selectively in relation to the other memory cells. The reason for this is the large bandwidth of the threshold values (G1) for the erasure voltages, which ranges from a potential (Verasemin) to a potential (Verasemax). The invention proposes a semiconductor memory and a method for operating the latter, in which simultaneous biasing of all the bit lines and word lines and a specific choice of the electrical potentials allow a single memory cell to be erased selectively in relation to the other memory cells.

25 Claims, 3 Drawing Sheets

INTEGRATED SEMICONDUCTOR MEMORY WITH AN ARRANGEMENT OF NONVOLATILE MEMORY CELLS, AND METHOD

This application claims priority to German Patent Application 10 2005 004 107.8, which was filed Jan. 28, 2005, and is incorporated herein by reference.

TECHNICAL FIELD

The invention relates to an integrated semiconductor memory with an arrangement of nonvolatile memory cells. The invention also relates to a method for operating such a semiconductor memory.

BACKGROUND

Integrated semiconductor memories can be classified according to the storage time for stored information. Volatile semiconductor memories, such as DRAMs (Dynamic Random Access Memories), have memory cells, which store the written information only for fractions of seconds and therefore have to be continually refreshed. In nonvolatile semiconductor memories, on the other hand, stored information is retained over a long period, typically several years, even after the power supply is turned off.

A particularly space-saving arrangement of memory cells is attained in semiconductor memories whose memory cells have layer stacks, requiring no kind of selection transistor, at locations at which bit lines and word lines cross. In such memory types, called "cross-point arrays," the substrate area, which is required per memory cell is obtained from the grid dimension of the bit lines and word lines.

This design can be used to fabricate semiconductor memories, for example, whose storage medium is a solid electrolyte. A layer stack, which contains both a layer comprising the solid electrolyte and the metallic layer, is connected to interconnects on opposite sides. The interconnects, which can be called bit lines and word lines, for example, can be used to apply electrical voltages. The layer stack, which is arranged between a bit line and a word line, respectively, has a current flowing through it when the voltage is applied between the bit line and the word line. The magnitude of this current is dependent on the nonreactive resistance of the layer stack.

On one side of a layer formed from a solid electrolyte, the layer stack has a metallic layer. Depending on the direction of current and the level of the applied voltage, metal ions coming from the metallic layer diffuse either into the layer from the solid electrolyte, or from the latter back into the metallic layer. When the metal ions, which have diffused into the layer comprising the solid electrolyte have diffused as far as the solid-electrolyte layer's boundary face, which is remote from the metallic layer, the nonreactive resistance of the layer stack is reduced overall; the nonvolatile memory cell is switched to low impedance, which corresponds to a programmed memory state, for example. By contrast, when a sufficiently high voltage of opposite polarity is applied, the metal ions diffuse out of the solid electrolyte again, i.e., back into the metallic layer. This restores a high-impedance state of the memory cell. This high-impedance state of the memory cell corresponds to an unprogrammed memory state, for example.

Nonvolatile semiconductor memories of the design described above are known by the name PMC (Programmable Metallization Cell) or else CBRAM (Conductive Bridging Random Access Memory). Memory cells of this type are elements, which switch resistively, i.e., on the basis of resistance. The magnitude of the nonreactive resistance of the layer stack in each individual cell represents an item of memory information which signifies a digital "0" or "1," depending on whether the layer stack is at high impedance or low impedance, respectively. Physically, the stored item of information is obtained from the distribution of the metal ions within the solid electrolyte, which have diffused in. This distribution and the resultant memory state (high impedance or low impedance) can be read by applying a measurement voltage between the bit line and the word line to which the memory cell is connected.

Solid-electrolyte memory cells have no precise limit values (identical for all the memory cells in the same memory circuit) for those threshold voltages at which the transition from the high-impedance state to the low-impedance state or vice versa occurs. By way of example, the minimum value for the erasure voltages at which an originally low-impedance memory cell changes to high impedance varies within the same memory circuit from cell to cell. Similarly, the minimum value for the writing voltage (negative arithmetic sign) above which an originally high-impedance memory cell changes to low impedance varies from cell to cell. Instead of discrete threshold voltages, today's solid-electrolyte semiconductor memories thus have threshold voltage ranges of comparatively large bandwidth for the voltages, which are to be applied, which are required for reprogramming the memory cells. The bandwidths of the threshold voltages are also not inconsiderable in comparison with the mean value of the respective threshold voltage. Frequently, the bandwidth of the erasure voltages (i.e., the distribution of the memory-cell-specific values of the minimum erasure voltage) over the applied voltage is greater than the bandwidth of the writing voltages, i.e., the programming voltages. In particular, even the smallest possible erasure voltage at which at least some memory cells, if biased with this voltage, change to high impedance is lower than the absolute value of that writing voltage at which at least one of the memory cells, if biased with this writing voltage, changes to low impedance.

The absolute values of the threshold voltages for the two reprogramming operations, namely the erasure voltages and the writing voltages, are thus not the same. Even the random distributions of the level of the erasure voltages and the level of the writing voltages are not symmetrical with respect to one another for a reversal of arithmetic sign in the applied voltage. By way of example, if a negative voltage with a particular absolute value already reliably brings about programming, i.e., writing to a memory cell, specifically regardless of which individual memory cell is biased with it, then it is not yet inevitable that a (positive) erasure voltage with the same absolute value must bring about an erasure operation in the memory cell which is biased with it. The reason is that the wider distribution of the erasure voltages in comparison with the writing voltages means that the memory circuit contains memory cells, which do not change to high impedance until the erasure voltages are even higher.

Since the memory state in a semiconductor memory, i.e., the level of the nonreactive resistance of the respective memory cell, needs to be clearly defined, the voltages applied for the purpose of a writing or erasure operation need to be outside of the bandwidths of the writing voltages and the erasure voltages.

A voltage for a reprogramming operation is applied between the bit line and the word line. However, since a solid-electrolyte semiconductor memory, in the form of a cross-point array, has a multiplicity of memory cells connected to each bit line and each word line, but there are no selection transistors present, applying the respective programming voltage exclusively via the bit line or exclusively via the word line would respectively reprogram all the memory cells which are connected to the respective line. For this reason, to write an item of information to a memory cell, the necessary writing voltage is applied to the bit line and to the word line in the form of two voltage components, which together provide the necessary writing voltage. By way of example, the potential of the bit line to which the memory cell is connected is increased by a particular absolute value and at the same time the potential of the word line to which the memory cell is connected is lowered by a particular absolute value.

However, since a cross-point array has no selection transistors in it, the voltage components are simultaneously also applied to those layer stacks which are connected to the same bit line but a different word line, or to the same word line but a different bit line. If they are situated within the bandwidth of the erasure voltages or the bandwidth of the writing voltages, or their absolute value is even greater, these voltage components can result in inadvertent reprogramming of further memory cells.

At least for a programming operation, i.e., a writing operation, these voltage components can be chosen to be below these lower bandwidth limits, so that exclusively the memory cell situated at the cross point between the selected bit line and the selected word line is programmed. This is possible because the bandwidth of the writing voltages in the case of solid-electrolyte memory circuits is so small that a voltage, which is half the magnitude of a writing voltage, sufficiently high for reliable programming, has an absolute value which is so small that it is situated outside of the bandwidth of the threshold voltages for the programming operation.

For the converse reprogramming operation, namely erasure, the even larger bandwidth of the erasure voltages in solid-electrolyte semiconductor memories means that selective access to individual memory cells is not known. Instead, whole rows, columns or blocks of memory cells, which are actuated by the same respective group of bit lines and word lines or of first and second lines, would need to be erased simultaneously. There is thus not yet any known way of erasing individual memory cells selectively in solid-electrolyte semiconductor memories.

It would be desirable to provide an integrated semiconductor memory having resistively switching memory cells whose memory cells can be erased independently of one another and selectively in relation to the respective other memory cells. In particular, the semiconductor memory to be provided needs to allow selective access to individual memory cells during erasure even in the case of solid-electrolyte memory cells whose erasure voltages are distributed over a wider voltage range than their writing voltages. Another aim is to provide a method, which can be used to perform a selective erasure operation on individual memory cells of such a semiconductor memory.

SUMMARY OF THE INVENTION

Embodiments of the invention provide a semiconductor memory having an arrangement of nonvolatile memory cells, in which the arrangement has a multiplicity of first lines and second lines which can be electrically biased for the purpose of programming and erasing memory cells. Each memory cell is coupled to a first line and a second line and has a layer stack that has a solid electrolyte and that is arranged between the respective first line and the respective second line, to which the memory cell is coupled. The layer stacks in the memory cells are in a form such that their ohmic resistance can be altered by the level of a voltage applied between the respective first line and the respective second line and assumes a first value at a sufficiently high positive voltage and a different, second value at a sufficiently high negative voltage. The first lines and the second lines can be actuated such that electrical potentials on all the first lines and on all the second lines are changed, for the purpose of selectively erasing a selected memory cell selectively in relation to all the other memory cells in the arrangement of memory cells, such that, respectively, that first line to which the selected memory cell is connected is biased with a first potential selectively in relation to all the other first lines, and that second line to which the selected memory cell is connected can be biased with a second potential selectively in relation to all the other second lines, and all the other first lines are biased with a third potential and all the other second lines are biased with a fourth potential. The potential difference between the first potential and the second potential is greater than a limit value for an erasure voltage, above which value any memory cell in the arrangement is reliably erased. The third and the fourth potential are proportioned such that, during the selective erasure of the selected memory cell, voltages applied to the other memory cells are so low that erasure operations and programming operations in the other memory cells are prevented.

In line with embodiments of the invention, an integrated semiconductor memory, which has layer stacks with a solid electrolyte as memory elements, actuates the first and second lines such that the solid-electrolyte memory cells can be erased individually, i.e., selectively in relation to the other memory cells. To date, no semiconductor memories on the basis of solid electrolytes have been known, in which the erasure operations can also be performed selectively on individual memory cells in addition to the writing operations, i.e., programming operations. By contrast, embodiments of the present invention allows the specific choice of the potentials with which the first and second lines are biased also to limit the erasure operation to a single memory cell without loosing memory contents from the other memory cells.

To prevent the other memory cells connected to the same first line or the same second line as the memory cell which is to be erased from being unintentionally reprogrammed, the invention involves all the other first and second lines also being electrically biased, but with different bias voltages than the selected first and second lines.

The embodiments of the invention are thus also based on the idea of using an additional degree of freedom for the electrical actuation, namely the level of the potential on those first and second lines to which the selected memory cell to be erased is currently not connected and which are therefore not actually involved in an erasure operation. The basic idea of electrically biasing these further first and second lines, too, in a suitable fashion in respect of that potential which these lines are at otherwise when the information in all the memory cells is maintained, allows reprogramming of those memory cells which are connected either just to the selected first line or just to the selected second line to be prevented. This means that for the first time, it is possible to erase a single solid-electrolyte memory cell selectively in relation to all other memory cells in the same arrangement of memory cells.

Preferably, the layer stacks in the memory cells have a high impedance when their nonreactive resistance assumes the first value, and have a low impedance when their nonreactive resistance assumes the second value.

Thus, a high-impedance state is produced by applying a voltage whose absolute value is sufficiently high and which has a positive arithmetic sign to the respective layer stack. In line with the convention used here, the layer stack changes to low impedance when the potential on the second line is much lower than that on the first line to which the respective memory cell is connected.

Preferably, the semiconductor memory evaluates the magnitude of the nonreactive resistance of the layer stacks, such that high-impedance memory cells are detected as erased memory cells and low-impedance memory cells are detected as programmed memory cells. In the erased state of a memory cell array, all the memory cells are therefore at high impedance. A memory cell programmed with low impedance corresponds to a digital "1," for example. The present invention therefore allows a digital "1" to be erased from a single memory cell selectively in relation to the other memory cells, i.e., to be converted to a digital "0." Alternatively, a digital "0" may also correspond to a low-impedance memory state and a digital "1" may correspond to a high-impedance memory state. In this case, selective erasure converts a digital "0" to a digital "1."

As regards the level of the electrical potentials, which are to be applied to the first and second lines, one preferred embodiment provides for the first, the second, the third and the fourth potential to be prescribed by the equations disclosed herein, where V1 denotes the first potential, V2 denotes the second potential, V3 denotes the third potential and V4 denotes the fourth potential. The first potential is applied to the selected first line to which the memory cell to be erased is connected. The second potential is connected to the second line to which the memory cell to be erased is connected. The third potential is applied to the other first lines, and the fourth potential is applied to the other second lines.

In the equations disclosed herein, which specify the level of these potentials, VPL is an arbitrary reference potential and Verasemax is a limit value for an erasure voltage, above which limit value any memory cell is reliably erased. This limit value is also described below; in FIG. 3, it can be found at the right-hand outer end of the distribution of threshold voltages in the range of positive voltages U for the transition to the high-impedance state. In the equations for the level of the voltages, which are to be applied to the first and second lines, OD denotes a real number, which is at least one, and EI denotes a real number, which is at most one. The magnitude of the parameter OD corresponds to a factor by which the first potential used for erasing the memory cell is excessive in relation to the level of the potential Verasemax. As a result, the erasure operation causes the memory cell to be erased with more certainty and more quickly.

The parameter EI describes a factor, which stipulates upper limits for the magnitude of the parameters c and d. The parameters c and d influence the level of the potentials V3 and V4 on the other first and second lines. The factor EI describes the factor by which potentials applied to the other lines turn out to be lower than is actually possible if the voltages applied to the other memory cells were to utilize the voltage range between the distributions of the writing and erasure voltages. The factor EI pertains additional certainty with regard to unintentional reprogramming of the other memory cells.

The parameter Verasemax denotes a limit value for an erasure voltage, above which limit value any memory cell is reliably erased. This means that this limit value indicates the upper end of the bandwidth of threshold voltages, at which memory cells which are initially programmed with low impedance change to high impedance. Since the threshold voltages for each memory cell in the semiconductor memory, which has resistively switchable solid-electrolyte elements are at different levels, only a relatively large bandwidth for a random distribution containing the threshold voltages of the individual memory cells can be specified for a multiplicity of memory cells in a memory cell array. Verasemax denotes the upper end of the distribution of the erasure voltages, at which each memory cell, if biased with this voltage, changes reliably to high impedance. It is entirely possible for the programming voltage to be higher, but it needs to be greater than Verasemax. The quotient of the erasure voltage used and Verasemax is described by the parameter OD.

Verasemin denotes that voltage which is at the lower limit of the distribution of the threshold voltages for the transition from the low-impedance state to the high-impedance state. Accordingly, Vwritemin denotes the upper limit for the bandwidth of the (negative) threshold voltages for the transition from the high-impedance state to the low-impedance state, i.e., the largest voltage value, with the smallest absolute value, on the voltage scale U within the distribution of the writing voltages.

Preferably, the parameters a, b, c and d are arbitrary real numbers. However, these parameters may also be chosen to be integers and, in particular, natural numbers, including zero, for the sake of simplicity. This does not result in any fundamental restriction to the content if it is considered that any desired numerical value can be represented in a sufficiently good approximation by a fractional-rational number.

In one embodiment, the parameter a has the value zero. This means that although the values of the potentials V1, V2, V3 and V4 applied to the first and second lines change, the voltages applied to the memory cells, which voltages are obtained from the difference between two respective instances of these potentials, remain unchanged. The parameter a merely moves the potential of all the first and second lines during selective erasure of a particular memory cell with respect to that reference potential VPL which is otherwise applied to the first and second lines when the programming states of all the memory cells are maintained unchanged.

In a further preferred, advantageous embodiment, the parameters c and d are chosen to be of equal magnitude. In this case, the difference between the potentials V1 and V3 is precisely the same magnitude as the difference between the potentials V2 and V4. The result of this, is that those memory cells 5c and 5d (FIG. 5) which are connected either just to the selected first line or to the selected second line are all biased with a voltage of equal magnitude. This means that the same level of safety factor against unintentional reprogramming is obtained for all these memory cells, specifically, regardless of whether the respective memory cell is connected to the same first line as the memory cell which is to be erased or to the same second line as the memory cell which is to be erased.

Preferably, the semiconductor memory is in a form such that all the first lines and all the second lines are biased with reference potential when the memory state of all the memory cells is maintained unchanged.

Preferably, the parameters b, c and d are chosen such that a negative voltage is applied to those memory cells (5b in FIG. 5) which are connected neither to the first line biased with the first potential nor to the second line biased with the second potential. This embodiment is advantageous because the bandwidth of the threshold values for erasure voltages gets closer to the voltage value 0 volt than the bandwidth of the threshold values for the programming voltages. For the purpose of selectively erasing a memory cell (the memory cell 5a in FIG. 5), the potential of the first line in question (11a in FIG. 5), to which the memory cell is connected, is raised and the potential of the second line in question (12a in FIG. 5) is lowered. To prevent the other memory cells (5c, 5d in FIG. 5), which are connected to the same first line or the same second line as the selected memory cell (5a in FIG. 5), from likewise being erased, the potential of the other first lines can be lowered and that of the other second lines can be raised. As a result, the other memory cells (5b in FIG. 5) have negative voltages applied to them, whose absolute value needs to be sufficiently small for these memory cells 5b not to be programmed, however. The (negative) voltage applied to these memory cells 5b may be chosen to be smaller (and its absolute value larger) than −Verasemin, i.e., it can assume any value within the range between Vwritemin and Verasemin, said value particularly being able to be between Vwritemin and −Verasemin. This allows for the asymmetry of the threshold value distributions, which will be explained below with reference to FIG. 3. This means that voltages which are smaller, i.e., negative, but whose absolute value is larger than −Verasemin can be applied to the memory cells 5b. This also allows for the circumstance that Verasemin is smaller for today's solid-electrolyte semiconductor memories than the absolute value of Vwritemin. The resultant gain in safety is greater the more numerically predominant the number of those memory cells (5b in FIG. 5) which are connected neither to the same first line nor to the same second line as the memory cell which is to be erased, which means that in this embodiment the greatest possible safety against incorrect programming is achieved within the memory cell array.

Accordingly, the parameters b, c and d are preferably chosen such that the absolute value of the voltage which is applied to those memory cells (5b in FIG. 5), which are connected neither to the first line biased with the first potential nor to the second line biased with the second potential is greater than the limit value (Verasemin) for a positive voltage, below which limit value an erasure operation is reliably prevented, and is less than the absolute value of the limit value (Vwritemin) for a negative voltage, above which limit value a programming operation is reliably prevented. This means that all these memory cells 5b have an altogether negative voltage applied to them whose absolute value is between the absolute values of the parameters Verasemin and Vwritemin, however, where Verasemin is positive but Vwritemin is negative and has a larger absolute value than Verasemin. This embodiment opens up a voltage range for bias voltages which are applied to the memory cells 5b connected by the unselected first and second lines, which is at a particularly large interval from the distribution of the threshold values for erasure voltages.

In addition, the parameters b, c and d are chosen such that when the selected memory cell (5a in FIG. 5) is erased, the magnitude of the voltages applied to the other memory cells (5b, 5c and 5d in FIG. 5) is less than the limit value for a positive voltage, below which limit value an erasure operation is reliably prevented, but is greater than the limit value for a negative voltage, above which limit value a programming operation is reliably prevented. The voltages applied to the other memory cells (5b, 5c and 5d) are then all situated between the parameters Verasemin and Vwritemin. In this regard, after the parameters a and b have been stipulated, particularly the inequalities which claim 4 contains for the parameters c and d need to be observed.

As regards the design of the memory cells, the layer stacks in the memory cells have, on one side of the solid electrolyte, a metallic layer from which metal ions diffuse into the solid electrolyte when a sufficiently high writing voltage is applied to the layer stack. This changes the memory cell to low impedance. If a sufficiently high erasure voltage is applied, on the other hand, then the metal ions diffuse out of the solid electrolyte back into the metallic layer, and the memory cell changes to high impedance. In the simplest case, the metallic layer is a metal layer or a layer made of a metal alloy. It may contain silver, for example.

By way of example, the nature of the material composition of the solid electrolyte and the metallic layer is such that threshold values for erasure voltages, at which low-impedance memory cells change to high impedance, and threshold values for programming voltages, at which high-impedance memory cells change to low impedance, for the multiplicity of memory cells are randomly distributed over voltage ranges, with the threshold values for erasure voltages being distributed over a wider voltage range than the threshold values for programming voltages. This is the case with solid-electrolyte memory cells. However, the present invention can fundamentally also be used to operate semiconductor memories, in which the bandwidth of the programming voltages is larger than the bandwidth of the erasure voltages.

By way of example, the nature of the material composition of the solid electrolyte and the metallic layer is such that the limit value for a positive voltage, below which limit value an erasure operation is reliably prevented, is less than the absolute value of the limit value for a negative voltage, above which limit value a programming operation is reliably prevented. Hence, although the parameter Vwritemin is negative, its absolute value is greater than that of the parameter Verasemin.

By way of example, provision is also made for the nature of the voltage dependency of the ohmic resistance of the layer stacks to be such that the limit value for an erasure voltage, above which limit value any memory cell is reliably erased, is greater than the absolute value of the limit value for a programming voltage, below which limit value any memory cell is reliably programmed. Particularly suitable for this are solid-electrolyte memory cells, in which the bandwidth of the erasure voltage extends as far as voltage values, which have a smaller absolute value than the bandwidth of the programming voltages.

Preferably, the solid electrolyte in the layer stacks contains a glass-like material. The solid electrolyte in the layer stacks may contain a chalcongenide, in particular, for example, the solid electrolyte may contain a compound comprising silver, germanium and selenium. In particular, silver ions may diffuse into this material. The metallic layer may thus be a pure silver layer, for example.

Finally, the first lines and the second lines are arranged on opposite sides of the layer stacks from one another.

DESCRIPTION OF THE DRAWINGS

The invention is described below with reference to the figures, in which.

The following list of reference symbols can be used in conjunction with the figures:
1 Semiconductor memory
2 Arrangement
5 Memory cell
5a Selected memory cell
5b, 5c, 5d Other memory cells
6 Solid electrolyte
7 Metal layer
8 Layer stack
11 First line
11a Selected first line
11b Other first lines
12 Second line
12a Selected second line
12b Other second lines
a, b, c, d Parameters
E1, E2 Threshold values
EI Parameter
I Current
ΔV Erasure voltage
OD Parameter
U Voltage
U1 First voltage
U2 Second voltage
U3 Third voltage
U4 Fourth voltage
Ω Nonreactive resistance
V1 First potential
V2 Second potential
V3 Third potential
V4 Fourth potential
Verasemax Limit value for an erasure voltage, above which limit value any memory cell is reliably erased
Verasemin Limit value for a positive voltage, below which limit value an erasure operation is reliably prevented
Vwritemax Limit value for a programming voltage, below which limit value any memory cell is reliably programmed
Vwritemin Limit value for a negative voltage, above which limit value a programming operation is reliably prevented
VPL Reference potential

DETAILED DESCRIPTION OF ILLUSTRATIVE EMBODIMENTS

Figure 1:
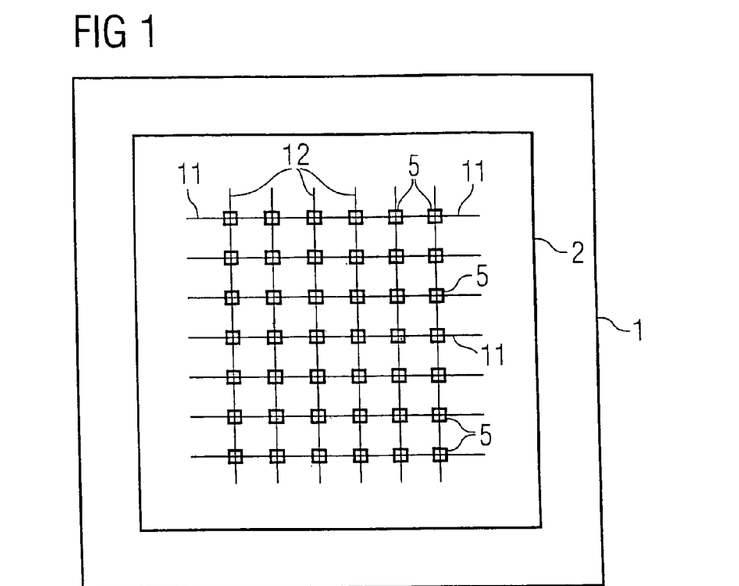
FIG. 1 shows a schematic plan view of an integrated semiconductor memory with an arrangement of nonvolatile memory cells.

FIG. 1 shows a schematic plan view of an integrated semiconductor memory 1 with an arrangement 2 of nonvolatile memory cells 5. The arrangement 2 also has a multiplicity of first lines 11 and second lines 12, which can be electrically biased for the purpose of programming and erasing the memory cells 5. Each memory cell 5 is connected to precisely one first line 11 and to precisely one second line 12; the arrangement 2 forms a cross-point array whose memory cells 5 are, in particular, solid-electrolyte memory cells, which require no selection transistor.

Figure 2:
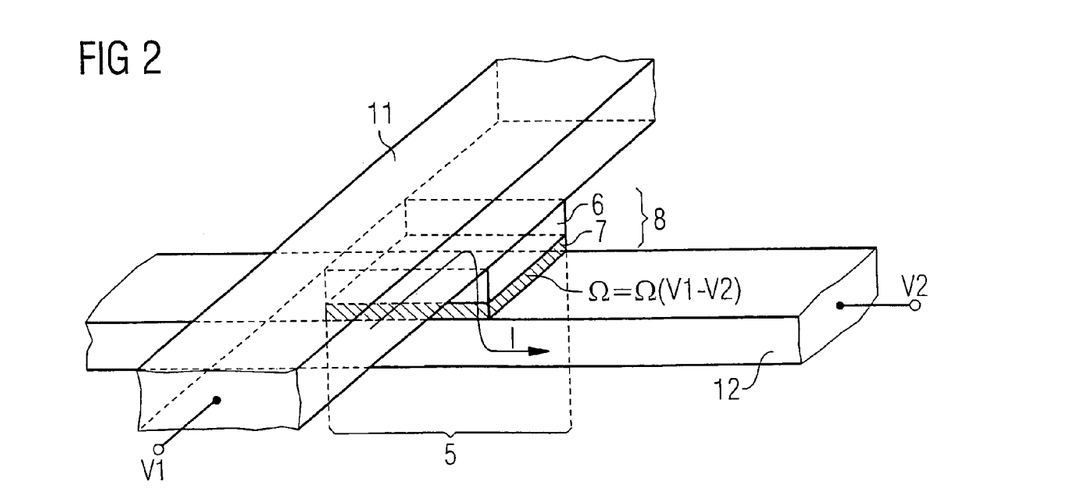
FIG. 2 shows a perspective view of a memory cell in the semiconductor memory from FIG. 1.

FIG. 2 shows a perspective view of a memory cell 5 in the semiconductor memory 1 from FIG. 1. At the location at which a first line 11 crosses a second line 12, a layer stack 8 connecting the first line 11 to the second line 12 is arranged between the first line 11 and the second line 12. The first line 11, the layer stack 8 and the second line 12, can thus be used to conduct a current I by biasing the first line 11 and the second line 12 with different electrical potentials V1, V2. The layer stack 8 has a layer comprising a solid electrolyte 6, and also a metallic layer 7, adjacent thereto. The metallic layer 7 contains a metal, such as silver, which can diffuse in ionic form into the layer on the solid electrolyte 6 provided that a negative voltage of sufficiently large absolute value is applied between the first line 11 and the second line 12. This alters the resistance (e.g., ohmic resistance) of the layer stack 8; the memory cell 5 changes to low impedance.

Figure 3:
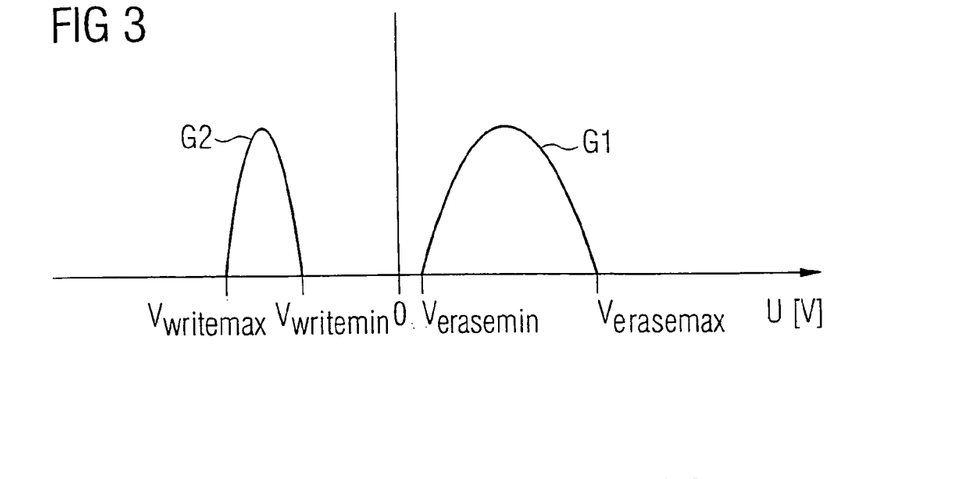
FIG. 3 shows the voltage dependency of the threshold values for writing and erasure voltages in a solid-electrolyte semiconductor memory.

FIG. 3 shows the dependency of the threshold values for the writing and erasure voltages in the solid-electrolyte semiconductor memory from FIG. 1. The frequency with which a particular threshold value for a particular level of erasure voltage or writing voltage occurs in an integrated semiconductor memory with a relatively large number of solid-electrolyte memory cells, is plotted as a function of the voltage U applied to an arbitrary memory cell. The function values thus correspond to the number of memory cells for which the threshold voltages currently assume the relevant value U.

The threshold values G1 for the erasure voltages have a relatively large bandwidth between the two limit values Verasemin and Verasemax. Verasemax is a limit value for an erasure voltage, above which limit value any memory cell is reliably erased. Verasemin is a limit value for a positive voltage, below which limit value an erasure operation is reliably prevented. Situated in between is the distribution of those voltage values for which the memory state for the memory cells in a semiconductor memory changes from the low-impedance memory state to the high-impedance memory state. For this reason, a positive voltage respectively converts an initially low-impedance memory state to a high-impedance memory state. For each memory cell, that threshold voltage at which this very change in the memory state occurs is in the range of distribution between Verasemin and Verasemax. Since reliably erasing information in an arbitrary memory cell in the semiconductor memory requires that an erasure voltage be chosen at which the high-impedance state is reached regardless of the individually actuated memory cell, erasure voltages which are higher than Verasemax are chosen in a solid-electrolyte semiconductor memory. Similarly, voltages which are applied to other memory cells must not be higher than Verasemin if it is necessary to prevent these other memory cells from being unintentionally erased.

The threshold values G2 for the writing voltages are in the range of negative voltages and have a smaller bandwidth than the threshold values G1 for the erasure voltage. Vwritemax is a limit value for a programming voltage below which any memory cell is reliably programmed. This means that in the case of a negative voltage whose absolute value is larger than that of Vwritemax, any memory cell which is biased with this voltage is reliably switched to low impedance and thus has information written to it. Vwritemin is a limit value for a negative voltage, above which limit value a programming operation is reliably prevented. The bandwidth of the threshold values G2 for the writing voltages thus extends from Vwritemin to Vwritemax and is small enough for it to be possible to write information to individual memory cells 5 in the semiconductor memory 1 from FIG. 1, without simultaneously writing further information to further memory cells. Since, as can be seen from FIG. 1, a respective multiplicity of memory cells 5 is connected to each first line 11, as to each second line 12, biasing a first or second line with a voltage whose absolute value is larger than Verasemax or Vwritemax, would result in all memory cells which are connected to the line in question being reprogrammed. Selective programming access to a single memory cell can therefore be effected only by applying to a selected first line and a selected second line, respectively, voltage components which, on that memory cell 5 which is situated at the point of intersection between the selected first line and the selected second line, together produce the voltage which is required for reprogramming. This prevents unintentional reprogramming of the other memory cells, which are connected either to the same first line or to the same second line as the memory cell, which is to be programmed.

This procedure can be carried out only because the distribution of the threshold values G2 for the writing voltages has a relatively small bandwidth. A comparable procedure for selectively erasing an individual memory cell is not known, however, and is also not possible, because the threshold values G1 of the erasure voltages have a much larger bandwidth on the voltage scale. In solid-electrolyte semiconductor memories, it would therefore be necessary to erase at least entire columns, rows or blocks of memory cells together.

This access during writing can be effected, by way of example, by virtue of the potential on the first line selected for erasure, to which the memory cell to be erased is connected, being lowered by half of the negative writing voltage, and the potential on the second line selected for erasure, to which the memory cell which is to be erased is connected, being raised by half of the writing voltage. The selected memory cell then has a negative voltage applied to it, which corresponds to the writing voltage and whose absolute value is greater than Vwritemax. Those further memory cells, which are connected to the same first line, encounter a negative voltage, which is half the magnitude of the voltage used for selective programming. Since the bandwidth of the threshold values G2 for programming is relatively small, however, the absolute value of the half-magnitude voltage applied there is small enough for it to be situated to the right of the limit value Vwritemin in FIG. 3 and thus not to be able to result in unintentional programming of further memory cells. Those memory cells, which are connected to the same second line as the memory cell, which is to be programmed, are also protected against simultaneous overwriting. They likewise have a voltage applied to them whose level is half of the writing voltage, since the potential on the second line has been lowered by just this absolute value.

Figure 4:
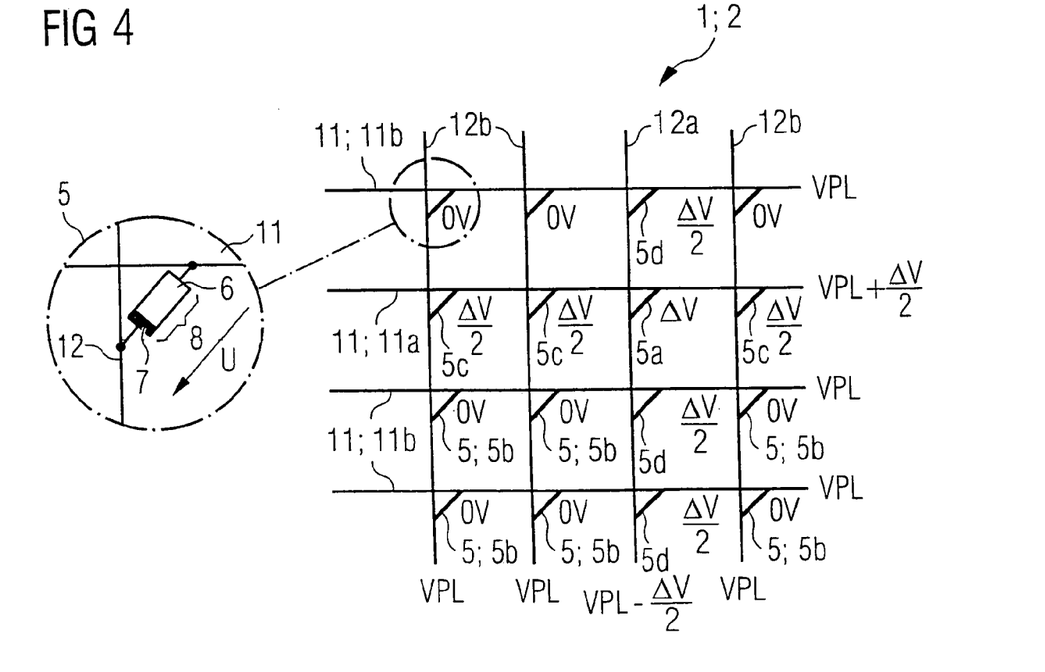
FIG. 4 shows a schematic illustration of a memory cell array in a semiconductor memory with first and second lines and also electrical potentials applied thereto for the purpose of illustrating the problem on which the invention is based.

FIG. 4 schematically shows a memory cell array in a semiconductor memory with the first and second lines and also the potentials applied to these lines and the voltages, which are obtained therefrom for the memory cells, specifically for the case in which the same procedure is applied for selectively erasing a single memory cell. The larger bandwidth of the erasure voltages means that this procedure does not work, but it is intended to clarify the problem on which the present invention is based with reference to FIG. 4.

The arrangement 2 of memory cells 5 in a semiconductor memory 1, shown merely schematically in FIG. 4, contains first lines 11 and second lines 12, from which a selected first line 11a and a selected second line 12a, respectively, are biased for the purpose of erasing the memory cell 5a, situated at the location at which they cross, selectively in relation to the other memory cells 5b, 5c, 5d. A detail enlargement shows an example of one possible orientation for the memory cells 5; the detail enlargement reveals that the respective layer comprising the solid electrolyte 6 is respectively connected to a first line 11, and the metal layer 7 in the layer stack 8 is connected to the respective second line 12. The voltage U is denoted as positive when the potential on the first line 11 is higher than the potential on the second line 12, to which the memory cell 5 is connected. FIG. 4 shows a matrix of 4×4 memory cells. If, as described above for the selective programming of a single memory cell, the erasure voltage for erasing a single memory cell were also split into two voltage components of equal magnitude with half the absolute value, a voltage element of $\Delta V/2$ relative to a reference potential VPL, would be applied to the selected first line 11a, for example. In addition, a voltage element of $\Delta V/2$ would be applied to a selected second line 12a, so that the memory cell 5a arranged at the location at which the lines 11a, 12a cross encounters an erasure voltage of $\Delta V$ and is erased. An erasure voltage at the level $\Delta V/2$ is applied to those memory cells 5c which are connected to the same first line 11a but to a different second line 12b than the selected memory cell 5a, since the potential on the selected first line 11a corresponds to just this absolute value. A voltage at the level $\Delta V/2$ is likewise applied to those memory cells 5d, which are merely connected to the same second line 12a as the memory cell 5a.

FIG. 3 reveals, that the erasure voltage required for successful erasure needs to be at least as high as Verasemax. It suffices if the erasure voltage is chosen to be slightly above Verasemax. However, half of the erasure voltage used, which corresponds to the value $\Delta V/2$, is within the bandwidth of the distributions of the erasure voltage, i.e., within the bandwidth between Verasemin and Verasemax. Depending on where the respective threshold value G1 for erasure is situated for the memory cells connected to the same first line 11a or the memory cells connected to the same second line 12a, these cells are erased or not erased at the same time as the memory cell 5a. Reliable erasure exclusively of the selected memory cell 5a selectively in relation to all other memory cells, particularly in relation to the memory cells 5c and 5d, is thus not possible. The reason for this is the large bandwidth of the threshold values G1 for the erasure voltages. FIG. 4 thus illustrates the problem on which the invention is based, that even when an erasure voltage is split over that first line and that second line to which an individual memory cell is connected, this memory cell cannot be erased selectively in relation to all other memory cells without reliably preventing the unintentional erasure of further memory cells. To achieve this, additional measures are required which are realized in the semiconductor memory proposed by the invention.

Figure 5:
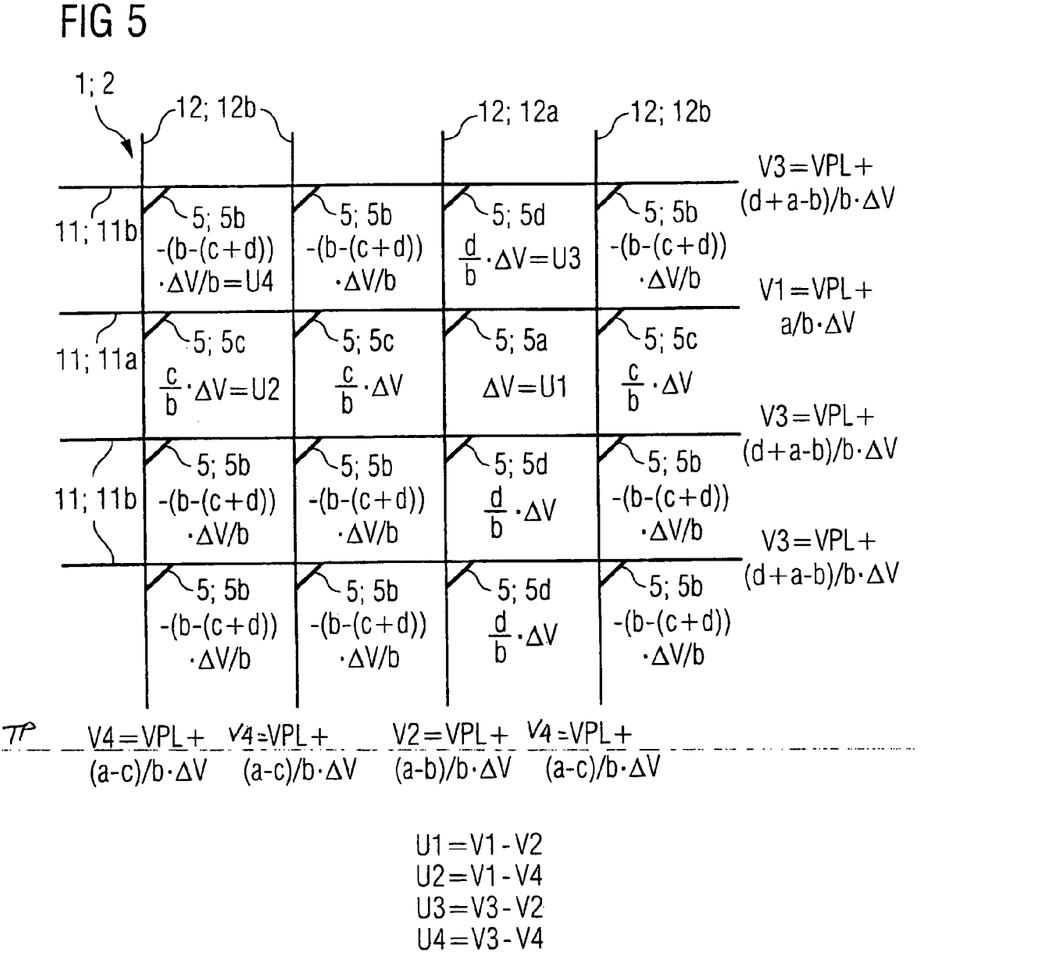
FIG. 5 shows a schematic illustration of a memory cell array in an inventive semiconductor memory with the inventive actuation of its lines for selectively erasing a single memory cell.

FIG. 5 schematically shows a memory cell array in the inventive semiconductor memory 1 which has an arrangement 2 of memory cells 5 which can be erased individually, i.e., selectively in relation to all other memory cells, by the inventive memory-internal actuation of the first line 11 and the second line 12. To erase a selected memory cell 5a, a selected first line 11a and a selected second line 12a, to which the selected memory cell 5a to be erased is connected, are biased. In line with the invention, first the voltage changes on the selected lines 11a, 12a have different levels chosen than in FIG. 4. Secondly in line with the invention, all other first lines 11b and all other second lines 12b are also biased at the same time, specifically with suitably chosen bias potentials. The combined action of these different bias voltages for all first and second lines 11a, 11b, 12a, 12b results in voltages on the memory cells 5 in a magnitude such that an individual selected memory cell 5a can be erased selectively and at the same time unintentional erasure of all other memory cells is reliably prevented.

The formulae indicated in FIG. 5 for the level of the potentials V1, V2, V3 and V4 with which the first and second lines 11, 12 need to be biased for the purpose of selectively erasing just a single memory cell 5a each contain the parameter VPL, which denotes a reference voltage. By way of example, the reference voltage VPL may be that voltage which is present on the first and second lines when no erasure operation is taking place and the information in all memory cells is maintained. Additionally, the voltages V1, V2, V3 and V4 contain the parameter $\Delta V$, which indicates the erasure voltage applied to the selected memory cell 5a, which is to be erased. This erasure voltage $U1=\Delta V$ is present exclusively on the memory cell 5a which is to be erased. The level of this first voltage U1 also governs those potentials V1, V2, V3 and V4, which are applied to the first and second lines 11, 12 in line with the invention in order to preclude unintentional erasure of further memory cells 5c and 5d. In the embodiment shown in FIG. 5, these potentials are obtained from the following equations:

$$V1=VPL+a/b*\Delta V$$

$$V2=VPL+(a-b)/b*\Delta V$$

$$V3=VPL+(d+a-b)/b*\Delta V$$

$$V4=VPL+(a-c)/b*\Delta V$$

In these equations, the parameters a, b, c and d denote real numbers which, to simplify matters, can be chosen to be integers and particularly to be natural numbers including zero, however. As a result, in the equations for the potentials V1 to V4 the respective discrepancy $\Delta V$ in the potential on the relevant line is provided with a factor, which represents a fractional-rational number and respectively has the parameter b in the denominator. The parameter a determines the level of that first line 11a to which the memory cell 5a which is to be erased is connected. The level of the potential V2 with which that second line 12a to which the memory cell 5a is connected, is chosen precisely such that the memory cell 5a contains precisely the first voltage U1 at the level of the erasure voltage $\Delta V$. The equation for the level of the fourth potential V4, which is used to bias the other second lines 12b, contains the further parameter c, the effect of which is that those memory cells 5c, which are connected to the selected first line 11a but to a different second line 12b than the memory cell 5a, which is to be erased, are biased with a second voltage U2 of c/b $\Delta V$. The factor c/b is less than one, in particular, but will be determined more precisely below. The equation for the potential V3, which is used to bias the other first lines 11b, contains the further parameter d. This means that those memory cells 5d, which are connected to the selected second line 12a but to a different first line 11b than the memory cell 5a, which is to be erased, are biased with the voltage $U3=d/b \, \Delta V$ relative to the reference potential VPL. The factor d/b is also less than one and is determined more precisely below. In FIG. 5, those memory cells 5b, which are connected neither to the selected first line 11a nor to the selected second line 11b, are biased with the fourth voltage of $U4=-(1-(c+d)/b)\Delta V$.

In the equations indicated in FIG. 5 for the potentials V1 to V4 and the voltages U1 to U4, $\Delta V$ denotes the chosen erasure voltage, as already described above. To prevent unintentional reprogramming of the memory cells 5b, 5c, 5d, particularly unintentional erasure of the memory cells 5c and 5d, and also unintentional programming of the memory cells 5b during erasure of the memory cell 5a, the following conditions are established:

Condition 1:

$$\Delta V \geq V_{erasemax}$$

Condition 2:

$$\frac{c}{b}\Delta V \leq V_{erasemin}; \frac{d}{b}\Delta V \leq V_{erasemin}$$

Condition 3:

$$\left(1-\frac{c+d}{b}\right)\Delta V < |V_{writemin}|$$

In addition, a parameter OD (overdrive) is defined which is greater than or equal to 1 and which indicates by how much the erasure voltage $\Delta V$ for the memory cell 5a, which is to be erased is chosen to be greater than the limit value Verasemax. Thus, the following applies:

$$\Delta V=OD*Verasemax.$$

In addition, a parameter EI (Erase Inhibit) is defined which is less than or equal to 1 and which indicates by what factor the absolute value of the applied voltage on those memory cells 5c and 5d, which are connected either to the selected first line 11a or to the selected second line 12a is less than Verasemin.

By inserting the parameters OD and EI into condition 2 the following is obtained:

$$\frac{c}{b}OD \cdot V_{erasemax} = \frac{d}{b}OD \cdot V_{erasemax} = EI \cdot V_{erasemin}$$

and by inserting them into condition 3 the following is obtained:

$$OD \cdot V_{erasemax} - 2EI \cdot V_{erasemax} < |V_{writemin}|$$

This means that the following restrictions are prescribed for the parameters c and d:

$$\frac{b}{2}\left(1-\frac{V_{writemin}}{OD \cdot V_{erasemax}}\right) \leq c \leq b\frac{EI \cdot V_{erasemin}}{OD \cdot V_{erasemax}}$$

$$\frac{b}{2}\left(1-\frac{V_{writemin}}{OD \cdot V_{erasemax}}\right) \leq d \leq b\frac{EI \cdot V_{erasemin}}{OD \cdot V_{erasemax}}$$

When these conditions for parameters c and d are observed, there is the assurance that when selectively erasing the memory cell 5a, the other memory cells 5c and 5d are protected against unintentional erasure and the other memory cells 5b, which are connected neither to the selected first line 11a nor to the selected second line 12a, are protected against unintentional programming. In particular, the range in which the voltage U4 applied to the other memory cells may be situated can be chosen such that it covers not just the voltage range between −Verasemin and Verasemin, but rather additionally the voltage range between Vwritemin and −Verasemin too. This allows for the asymmetry of the switching response of solid-electrolyte memory cells, and the voltages applied to the memory cells 5*c* and 5*d* can be chosen to be even smaller, because a voltage in the range between Vwritemin and −Verasemin can be applied to the memory cells 5*b* without inadvertently programming these memory cells.

To erase the memory cell 5*a*, the first potential V1 on the selected first line 11*a* is raised, for example, and the second potential V2 on the selected second line 11*b* is lowered. So that those memory cells 5*c* and 5*d*, which are connected only to one of the two lines 11*a*, 12*a*, are not likewise erased, the other lines 11*b*, 12*b* are also biased. The bias voltages V3, V4 on these other lines are determined by the parameters c, d, the magnitude of which is limited by the above inequalities, which are additional constraints here. As already described above, the factor OD is greater than or equal to 1 and the factor EI is less than or equal to 1. In particular, it can be seen that the parameters c and d are each smaller than b, the direct result of which is that the memory cells 5*b*, which are connected only to one of the selected lines 11*a*, 12*a* but not to the respective other selected line 12*a*, 11*a*, are biased with a voltage U2 or U3 which is smaller than ΔV.

The above inequalities for the level of the parameters c, d simultaneously ensure that the voltages U2, U3 with which the memory cells are biased, are less than or equal to Verasemin. There is also the assurance that the absolute value of the fourth voltage U4 is less than the absolute value of Vwritemin.

By choosing the potentials V1, V2, V3 and V4 on the first and second lines as indicated above, the integrated semiconductor memory can be operated in line with the invention such that any memory cell 5*a*, which is selected for selective erasure, can be erased selectively in relation to all other memory cells 5*b*, 5*c*, 5*d*. The potentials V1, V2, V3 and V4 are preferably applied at the same time and during the same period, i.e., in the same time interval, to the lines 11*a*, 11*b*, 12*a*, 12*b* so that there is always the assurance that unintentional erasure or overwriting of one of the other memory cells 5*b* is precluded.

Using the present invention, solid-electrolyte memory cells, in particular, will be able to be used such that they can be operated on any individual memory cell both when writing and when erasing, as in the case of a direct access memory with random selective access.

What is claimed is:

1. An integrated semiconductor memory comprising:
   a plurality of nonvolatile memory cells; and
   a plurality of first lines and second lines that can be electrically biased for the purpose of programming and erasing the memory cells;
   wherein each memory cell is coupled to a respective first line and a respective second line and includes a layer stack that has a solid electrolyte and that is arranged between the respective first line and the respective second line;
   wherein the layer stacks in the memory cells are in a form such that their resistance can be altered by the level of a voltage applied between the respective first line and the respective second line and assumes a first value at a sufficiently high positive voltage and a different, second value at a sufficiently high negative voltage;
   wherein the first lines and the second lines can be actuated such that electrical potentials on the first lines and on the second lines are changed, for the purpose of selectively erasing a selected memory cell selectively in relation to all the other memory cells in the arrangement of memory cells, such that, respectively, that first line to which the selected memory cell is coupled is biased with a first potential selectively in relation to all the other first lines, and that second line to which the selected memory cell is coupled is biased with a second potential selectively in relation to all the other second lines, and all the other first lines are biased with a third potential and all the other second lines are biased with a fourth potential;
   wherein a potential difference between the first potential and the second potential is greater than a limit value for an erasure voltage, above which limit value any memory cell in the arrangement is reliably erased; and
   wherein the third and the fourth potential are proportioned such that, during the selective erasure of the selected memory cell, voltages applied to the other memory cells are so low that erasure operations and programming operations in the other memory cells are prevented.

2. The semiconductor memory as claimed in claim 1, wherein the layer stacks in the memory cells have a high impedance when their resistance assumes the first value, and have a low impedance when their resistance assumes the second value.

3. The semiconductor memory as claimed in claim 1, wherein the semiconductor memory evaluates the magnitude of the resistance of the layer stacks such that high-impedance memory cells are detected as erased memory cells and low-impedance memory cells are detected as programmed memory cells.

4. The semiconductor memory as claimed in claim 1, wherein the first, second, third and fourth potentials are prescribed on the basis of the following conditions:

$$V1 = VPL + \frac{a}{b} OD \cdot V_{erasemax}$$

$$V2 = VPL + \frac{a-b}{b} OD \cdot V_{erasemax}$$

$$V3 = VPL + \frac{d+a-b}{b} OD \cdot V_{erasemax}$$

$$V4 = VPL + \frac{a-c}{b} OD \cdot V_{erasemax}$$

and $$\frac{b}{2}\left(1 - \frac{V_{writemin}}{OD \cdot V_{erasemax}}\right) \leq c \leq b \frac{EI \cdot V_{erasemin}}{OD \cdot V_{erasemax}}$$

$$\frac{b}{2}\left(1 - \frac{V_{writemin}}{OD \cdot V_{erasemax}}\right) \leq d \leq b \frac{EI \cdot V_{erasemin}}{OD \cdot V_{erasemax}}$$

where VPL is an arbitrary reference voltage, Verasemin is a limit value for a positive voltage, below which limit value an erasure operation is reliably prevented, and Vwritemin is a limit value for a negative voltage, above which limit value a programming operation is reliably prevented; and where OD is a real number which is at least equal to 1, EI is a real number which is at most equal to 1, and a, b, c and d are numbers.

5. The semiconductor memory as claimed in claim 4, wherein the parameters a, b, c and d are real numbers.

6. The semiconductor memory as claimed in claim 4, wherein the parameters a, b, c and d are each integers.

7. The semiconductor memory as claimed in claim 4, wherein the parameters a, b, c and d are each natural numbers.

8. The semiconductor memory as claimed in claim 4, wherein the parameter a is equal to 0.

9. The semiconductor memory as claimed in claim 4, wherein the parameters c and d are of equal magnitude.

10. The semiconductor memory as claimed in claim 4, wherein the semiconductor memory is in a form such that all the first lines and all the second lines are biased with the reference potential (VPL) when the memory state of all the memory cells is maintained unchanged.

11. The semiconductor memory as claimed in claim 4, wherein the parameters b, c and d are chosen such that a negative voltage is applied to those memory cells that are coupled neither to the first line biased with the first potential nor to the second line biased with the second potential.

12. The semiconductor as claimed in claim 1, wherein the parameters b, c and d are chosen such that the absolute value of the voltage that is applied to those memory cells that are coupled neither to the first line biased with the first potential nor to the second line biased with the second potential is greater than the limit value for a positive voltage, below which limit value an erasure operation is reliably prevented, and is less than the absolute value of the limit value for a negative voltage, above which limit value a programming operation is reliably prevented.

13. The semiconductor memory as claimed in claim 4, wherein the parameters b, c and d are chosen such that when the selected memory cell is erased the magnitude of the voltages applied to the other memory cells is less than the limit value for a positive voltage, below which limit value an erasure operation is reliably prevented, but is greater than the limit value for a negative voltage, above which limit value a programming operation is reliably prevented.

14. The semiconductor memory as claimed in claim 1, wherein the layer stacks in the memory cells have, on one side of the solid electrolyte, a metallic layer from which metal ions diffuse into the solid electrolyte when a sufficiently high writing voltage is applied to the respective layer stack.

15. The semiconductor memory as claimed in claim 14, wherein threshold values for erasure voltages, at which low-impedance memory cells change to high impedance, and threshold values for programming voltages, at which high-impedance memory cells change to low impedance, for the multiplicity of memory cells are randomly distributed over voltage ranges, with the threshold values for erasure voltages being distributed over a wider voltage range than the threshold values for programming voltages.

16. The semiconductor memory as claimed in claim 15, wherein the limit value for a positive voltage, below which limit value an erasure operation is reliably prevented, is less than the absolute value of the limit value for a negative voltage, above which limit value a programming operation is reliably prevented.

17. The semiconductor memory as claimed in claim 14, wherein the nature of the voltage dependency of the resistance of the layer stacks, is such that the limit value for an erasure voltage above which any memory cell is reliably erased is greater than the absolute value of the limit value for a programming voltage, below which limit value any memory cell is reliably programmed.

18. The semiconductor memory as claimed in claim 1, wherein the solid electrolyte in the layer stacks contains a glass-like material.

19. The semiconductor memory as claimed in claim 1, wherein the solid electrolyte in the layer stacks contains a chalcogenide.

20. The semiconductor memory as claimed in claim 1, wherein the first lines and the second lines are arranged on opposite sides of the layer stacks from one another.

21. A method for operating an integrated semiconductor memory, the method comprising:
providing an array of memory cells arranged in rows and columns, each memory cell in a row coupled to one of a plurality of first lines and each memory cell in a column coupled to one of a plurality of columns, each of the memory cell including a solid electrolyte disposed between one of the first lines and one of the second lines;
biasing a selected first line to a first potential;
biasing a selected second line to a second potential, wherein a potential difference between the first potential and the second potential is greater than a limit value for an erasure voltage, above which limit value a selected memory cell is reliably erased, the solid electrolyte of the selected memory cell disposed between the selected first line and the selected second line;
biasing unselected first lines to a third potential; and
biasing unselected second lines to a fourth potential, wherein the third potential and the fourth potential are proportioned such that, during erasure of the selected memory cell, voltages applied to unselected memory cells are such that erasure operations and programming operations in the unselected memory cells are prevented;
whereby the selected memory cell is erased selectively in relation to the unselected memory cells.

22. The method as claimed in claim 21, wherein the first potential (V1), the second potential (V2), the third potential (V3) and the fourth potential (V4) are prescribed on the basis of the following conditions:

$$V1 = VPL + \frac{a}{b} OD \cdot V_{erasemax}$$

$$V2 = VPL + \frac{a-b}{b} OD \cdot V_{erasemax}$$

$$V3 = VPL + \frac{d+a-b}{b} OD \cdot V_{erasemax}$$

$$V4 = VPL + \frac{a-c}{b} OD \cdot V_{erasemax}$$

and $$\frac{b}{2}\left(1 - \frac{V_{writemin}}{OD \cdot V_{erasemax}}\right) \leq c \leq b \frac{EI \cdot V_{erasemin}}{OD \cdot V_{erasemax}}$$

$$\frac{b}{2}\left(1 - \frac{V_{writemin}}{OD \cdot V_{erasemax}}\right) \leq d \leq b \frac{EI \cdot V_{erasemin}}{OD \cdot V_{erasemax}}$$

wherein:
VPL is an arbitrary reference voltage;
Verasemin is a limit value for a positive voltage, below which limit value an erasure operation is reliably prevented;
Vwritemin is a limit value for a negative voltage, above which limit value a programming operation is reliably prevented,
OD is a real number which is at least equal to 1;
EI is a real number which is at most equal to 1; and
a, b, c and d are numbers.

23. The method as claimed in claim 22, wherein each of the first potential (V1), the second potential (V2), the third potential (V3) and the fourth potential (V4) is different than the level of a reference voltage (VPL).

24. The method as claimed in claim 23, wherein each of the first potential (V1), the second potential (V2), the third potential (V3) and the fourth potential (V4) is different than a voltage that is used to bias the first lines and the second lines when none of the memory cells is being erased or programmed.

25. The method as claimed in claim 22, wherein the first potential (V1), the second potential (V2), the third potential (V3) and the fourth potential (V4) are stipulated by choosing the parameters a, b, c and d such that the parameter a is not equal to zero, the parameters b and c are both different than the parameter a, and the parameter d is different than the difference between the parameters b and a.

* * * * *